(12) United States Patent
Vaughan et al.

(10) Patent No.: US 7,893,693 B2
(45) Date of Patent: Feb. 22, 2011

(54) ASSYMETRIC RADIO FREQUENCY MAGNETIC LINE ARRAY

(75) Inventors: J. Thomas Vaughan, Stillwater, MN (US); Gregor Adriany, Minneapolis, MN (US); Kamil Ugurbil, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 11/415,366

(22) Filed: May 1, 2006

(65) Prior Publication Data

US 2006/0255806 A1 Nov. 16, 2006

Related U.S. Application Data

(63) Continuation of application No. 11/209,450, filed on Aug. 23, 2005, now abandoned, which is a continuation of application No. 10/637,261, filed on Aug. 8, 2003, now Pat. No. 6,958,607, which is a continuation of application No. 09/919,479, filed on Jul. 31, 2001, now Pat. No. 6,788,056.

(60) Provisional application No. 60/222,144, filed on Jul. 31, 2000.

(51) Int. Cl.
*G01V 3/00* (2006.01)

(52) U.S. Cl. ..................................... 324/318

(58) Field of Classification Search ......... 324/300–322; 600/410–435; 333/219–235; 343/720–723, 343/729–730, 741–752, 767–771, 789–792, 343/850–873, 893, 898, 904–916
See application file for complete search history.

(56) References Cited

U.S. PATENT DOCUMENTS 3,757,204 A 9/1973 Hyde (Continued)

FOREIGN PATENT DOCUMENTS

EP 0 290 187 11/1988

(Continued)

OTHER PUBLICATIONS

Adriany, G. , "Shielded Surface Coils and Halfvolume Cavity Resonators for Imaging and Spectroscopy Applications at 7 Tesla", *Proceedings of the International Society for Magnetic Resonance in Medicine, 8th Scientific Meeting*, vol. 1, (2000),563.

(Continued)

*Primary Examiner*—Melissa J Koval
*Assistant Examiner*—Dixomara Vargas
(74) *Attorney, Agent, or Firm*—Seager, Tufte & Wickhem, LLC

(57) ABSTRACT

An apparatus comprises a radio frequency magnetic field unit to generate a desired magnetic field. In one embodiment, the radio frequency magnetic field unit includes a first aperture that is substantially unobstructed and a second aperture contiguous to the first aperture. In an alternative embodiment, the radio frequency magnetic field unit includes a first side aperture, a second side aperture and one or more end apertures. In one embodiment of a method, a current element is removed from a radio frequency magnetic field unit to form a magnetic field unit having an aperture. In an alternative embodiment, two current elements located opposite from one another in a radio frequency magnetic field unit are removed to form a magnetic filed unit having a first side aperture and a second side aperture.

22 Claims, 10 Drawing Sheets

U.S. PATENT DOCUMENTS

| | | |
|---|---|---|
| 4,439,733 A | 3/1984 | Hinshaw et al. |
| 4,463,328 A | 7/1984 | Doty |
| 4,506,224 A | 3/1985 | Krause |
| 4,590,427 A | 5/1986 | Fukushima et al. |
| 4,602,234 A | 7/1986 | Butson |
| 4,620,155 A | 10/1986 | Edelstein |
| 4,634,980 A | 1/1987 | Misic et al. |
| 4,680,548 A | 7/1987 | Edelstein et al. |
| 4,686,473 A | 8/1987 | Chesneau et al. |
| 4,691,163 A | 9/1987 | Blass et al. |
| 4,692,705 A | 9/1987 | Hayes |
| 4,694,255 A | 9/1987 | Hayes |
| 4,712,067 A | 12/1987 | Roschmann et al. |
| 4,714,887 A | 12/1987 | Meissner et al. |
| 4,724,389 A | 2/1988 | Hyde et al. |
| 4,733,190 A | 3/1988 | Dembinski |
| 4,736,161 A | 4/1988 | Prevot et al. |
| 4,737,718 A | 4/1988 | Kemner et al. |
| 4,742,320 A | 5/1988 | Pfizenmaier et al. |
| 4,746,866 A | 5/1988 | Roschmann |
| 4,751,464 A | 6/1988 | Bridges |
| 4,763,076 A | 8/1988 | Arakawa et al. |
| 4,792,760 A | 12/1988 | Jacob et al. |
| 4,799,016 A | 1/1989 | Rezvani |
| 4,812,761 A | 3/1989 | Vaughan |
| 4,812,764 A | 3/1989 | Bendall |
| 4,820,985 A | 4/1989 | Eash |
| 4,820,987 A | 4/1989 | Mens |
| 4,833,409 A | 5/1989 | Eash |
| 4,839,594 A | 6/1989 | Misic et al. |
| 4,875,013 A | 10/1989 | Murakami et al. |
| 4,879,515 A | 11/1989 | Roemer |
| 4,888,555 A | 12/1989 | Vaughan |
| 4,916,418 A | 4/1990 | Rath |
| 4,928,064 A | 5/1990 | Keren |
| 4,939,465 A | 7/1990 | Biehl et al. |
| 4,952,878 A | 8/1990 | Mens et al. |
| 4,992,737 A | 2/1991 | Schnur |
| 5,017,872 A | 5/1991 | Foo et al. |
| 5,045,792 A | 9/1991 | Mehdizadeh |
| 5,049,821 A | 9/1991 | Duensing et al. |
| 5,053,711 A | 10/1991 | Hayes et al. |
| 5,055,853 A | 10/1991 | Garnier |
| 5,075,624 A | 12/1991 | Bezjak |
| 5,143,688 A | 9/1992 | Mansfield |
| 5,144,240 A | 9/1992 | Mehdizadeh et al. |
| 5,172,085 A | 12/1992 | Glenat et al. |
| 5,185,573 A | 2/1993 | Larson, III |
| 5,196,797 A | 3/1993 | Tropp |
| 5,212,449 A | 5/1993 | Gentsch et al. |
| 5,221,902 A | 6/1993 | Jones et al. |
| 5,260,658 A | 11/1993 | Greim et al. |
| 5,270,656 A | 12/1993 | Roberts et al. |
| 5,277,183 A | 1/1994 | Vij |
| 5,304,932 A | 4/1994 | Carlson |
| 5,311,160 A | 5/1994 | Higuchi et al. |
| 5,349,297 A | 9/1994 | DeMeester et al. |
| 5,363,113 A | 11/1994 | Mametsa et al. |
| 5,370,656 A | 12/1994 | Shevel |
| 5,381,122 A | 1/1995 | Laskaris et al. |
| 5,382,904 A | 1/1995 | Pissanetzky |
| 5,477,146 A | 12/1995 | Jones |
| 5,510,714 A | 4/1996 | Takahashi et al. |
| 5,514,337 A | 5/1996 | Groger et al. |
| 5,530,355 A | 6/1996 | Doty |
| 5,530,424 A | 6/1996 | Harrison et al. |
| 5,530,425 A | 6/1996 | Harrison |
| 5,539,315 A | 7/1996 | Cory et al. |
| 5,543,711 A | 8/1996 | Srinivasan et al. |
| 5,543,713 A | 8/1996 | Arakawa et al. |
| 5,557,247 A | 9/1996 | Vaughn |
| 5,581,186 A | 12/1996 | Keller |
| 5,596,276 A | 1/1997 | Nakagawa et al. |
| 5,619,996 A | 4/1997 | Beresten |
| 5,646,962 A | 7/1997 | Harrison |
| 5,699,801 A | 12/1997 | Atalar et al. |
| 5,739,812 A | 4/1998 | Mochizuki et al. |
| 5,742,165 A | 4/1998 | Snelten et al. |
| 5,744,957 A | 4/1998 | Vaughan |
| 5,757,189 A | 5/1998 | Molyneaux et al. |
| 5,841,288 A | 11/1998 | Meaney et al. |
| 5,877,732 A | 3/1999 | Ziarati |
| 5,886,596 A | 3/1999 | Vaughan |
| 5,892,359 A * | 4/1999 | Yui et al. ............... 324/318 |
| 5,898,306 A | 4/1999 | Liu et al. |
| 5,903,198 A | 5/1999 | Weiss |
| 5,949,311 A | 9/1999 | Weiss et al. |
| 5,986,455 A | 11/1999 | Magnuson |
| 5,990,681 A | 11/1999 | Richard et al. |
| 5,998,999 A | 12/1999 | Richard et al. |
| 6,008,649 A | 12/1999 | Boskamp et al. |
| 6,023,166 A | 2/2000 | Eydelman |
| 6,029,082 A | 2/2000 | Srinivasan et al. |
| 6,040,697 A | 3/2000 | Misic |
| 6,054,854 A | 4/2000 | Kawamoto |
| 6,060,882 A | 5/2000 | Doty |
| 6,060,883 A | 5/2000 | Knuttel |
| 6,133,737 A | 10/2000 | Greim |
| 6,150,816 A | 11/2000 | Srinivasan |
| 6,177,797 B1 | 1/2001 | Srinivasan |
| 6,201,392 B1 | 3/2001 | Anderson et al. |
| 6,215,307 B1 | 4/2001 | Sementchenko |
| 6,232,779 B1 | 5/2001 | Tropp et al. |
| 6,236,206 B1 | 5/2001 | Hartman et al. |
| 6,323,779 B1 | 11/2001 | Murakami et al. |
| 6,369,570 B1 | 4/2002 | Wong et al. |
| 6,396,271 B1 | 5/2002 | Burl et al. |
| 6,420,871 B1 | 7/2002 | Wong et al. |
| 6,433,548 B1 * | 8/2002 | Furuta et al. ............... 324/318 |
| 6,501,274 B1 | 12/2002 | Ledden |
| 6,633,161 B1 * | 10/2003 | Vaughan, Jr. ............... 324/318 |
| 6,788,056 B2 | 9/2004 | Vaughan et al. |
| 6,958,607 B2 | 10/2005 | Vaughan et al. |
| 7,215,120 B2 * | 5/2007 | Vaughan ............... 324/318 |
| 2002/0079996 A1 | 6/2002 | Zhang et al. |
| 2002/0180439 A1 | 12/2002 | Lee |
| 2004/0012391 A1 | 1/2004 | Vaughan, Jr. |
| 2004/0155656 A1 | 8/2004 | Leussler |
| 2006/0001426 A1 | 1/2006 | Vaughan et al. |
| 2008/0129294 A1 | 6/2008 | Leussler |

FOREIGN PATENT DOCUMENTS

| | | |
|---|---|---|
| EP | 0 366 188 | 5/1990 |
| EP | 0414474 | 2/1991 |
| JP | 60128339 | 7/1985 |
| JP | 03032365 | 2/1992 |
| JP | 04-246332 | 9/1992 |
| JP | 04246332 | 9/1992 |
| JP | 04364003 | 12/1992 |
| JP | 05-031092 | 2/1993 |
| JP | 07321514 A2 | 12/1995 |
| JP | 02-503993 | 6/1996 |
| JP | 08-257011 | 10/1996 |
| JP | 08257011 | 2/1997 |
| JP | 01-503360 | 3/2001 |
| WO | WO-9837438 A1 | 8/1998 |
| WO | WO-9954759 A1 | 10/1999 |
| WO | WO-00/72033 | 11/2000 |

OTHER PUBLICATIONS

Ballon, D., "A 64 MHz Half-Birdcage Resonator for Clinical Imaging", *Journal of Magnetic Resonance*, 90, (1990),131-140.

Bancroft, R., *In: Microstrip and Printed Antenna Design*, Chapter One, Obtained from http://store.noblepub.com/pdfs/msantenna1.pdf,(2004),8 p.

Bogdanov, G., et al., "Coupled microstrip line transverse electromagnetic resonator model for high-field magnetic resonance imaging", *Magnetic Resonance in Medicine*, vol. 47, No. 3, (Mar. 2002),579-93.

Bushong, S. C., *In: Magnetic Resonance Imaging—Physical and Biological Principles, Second Edition*, Mosby-Year Book, Inc., St. Louis, MO.,(1996),160-163.

Codreanu, I., et al., "Influence of Dielectric Substrate on the Responsivity of Microstrip Dipole-Antenna-Coupled Infrared Microbolometers", *Applied Optics*, 41(10), (Apr. 1, 2002),1835-1840.

Dravin, V. A., "Measurements of the Effective Electrodynamical Parameters of the Nb Microstrip Resonator", *International Conference on Materials and Mechanisms of Superconductivity High Temperature Superconductors VI*, vol. 341-348(Part 4), (Feb. 25, 2000),2675-2676.

Durr, W., "A Dual-Frequency Circularly Polarizing Whole-Body MR Antenna for 69/170 MHz", *Magnetic Resonance in Medicine*, 19(2), (1991),446-455.

Gao, S. C., et al., "A Dual-Frequency Compact Microstrip Patch Antenna", *Radio Science*, 36(6), (Nov.-Dec. 2001),1669-1682.

Gasson, J., "Modified Birdcage Coils for Targeted Imaging", *Magnetic Resonance Imaging*, 13(7), (1995),1003-1012.

Gupta, K. C., "Microwave Circuits", *Wiley Encyclopedia of Electrical and Engineering Online*, www.mrw.interscience.wiley.com,(Observed Dec. 27, 1999),33 pgs.

Hetherington, H. P., et al., "Evaluation of Cerebral Gray and White Matter Metabolite Differences by Spectroscopic Imaging at 4.1T", *Magnetic Resonance in Medicine*, 32, (1994),565-571.

How, "Microstrip Antennas", *Wiley Encyclopedia of Electrical and Electronic Engineering Online*, www.mrw.interscience.wiley.com,(Observed Apr. 28, 2000),4 pgs.

How, H., et al., "Microstrip Antennas", *Wiley Encyclopedia of Electrical and Engineering Online*, 2000, 44 pgs.

Hwang, F., et al., "Automatic probe tuning and matching", *Magnetic Resonance in Medicine*, vol. 39, No. 2, (Feb. 1998),214-22.

Kanal, E., et al., "Safety Considerations in MR Imaging", *Radiology*, 176, (Abstract Only),(1990),593-606.

Kim, S. S., "Miniature Magnetic Resonance Spectrometers", *16th DASC AIAA/IEEE Digital Avionics Systems Conference*, (1997),2.2-14-23.

Ledden, Patrick J., "An Four Port Drive Flat-element transmission-Line coil for brain imaging at 3T", *Proc. of the In'tl Soc for Magnetic Resonance in Medicine*, (2000),p. 1395.

Ledden, P. J., "Use of a Transmission Line Resonator as a Volume Phased Array", *Proceedings of the International Society for Magnetic Resonance in Medicine, 8th Scientific Meeting*, (Apr. 2000),1396.

Lee, R. F., "Chapter 6. Planar Strip Array (PSA) Antenna", *In: Parallel Magnetic Resonance Imaging—Encoding Theory and Antenna Design*, (Jul. 2000),85-107.

Lee, et al., "Planar Stip Array Antenna for Parallel Spatial Encoded MRI", *Wiley Encyclopedia of Electrical and Electronics Engineering Online*, www.mrw.interscience.wiley.com,(1999).

Ma, Z., "Microstrip Lines", *Wiley Encyclopedia of Electrical and Engineering Online*, 1999, www.mrw.interscience.wiley.com,(Observed Dec. 27, 1999),23 pgs.

Mickelson, A. R., "Active Antennas", *Wiley Encyclopedia of Electrical and Engineering Online*, 1999, www.mrw.interscience.wiley.com,(Observed Dec. 27, 1999),27 pgs.

Montrose, B., et al., "Dual Polarization Star Microstrip Antennas", Obtained from http:// nemes.colorado.edu/microwave/papers/2001/Eu_BmdpBP01.pdf,(2001),4 p.

Oldenburg, J., "What is a Microstrip Transmission Line and How Do You Design One?", Course Material, Obtained from http://www.csus.edu/indiv/o/oldenburgj/EEE%20161%20Course%20Material.htm,(2004),3 p.

Price, R. R., et al., "Quality Assurance Methods and Phantoms for Magnetic Resonance Imaging: Report of AAPM Nuclear Magnetic Resonance Task Group No. 1", *Med. Phy.*, 17(2), (1990),287-295.

Raida, Z. K., et al., "Chapter 3.2 Microstrips; Chapter 4.5 Microstrip Antenna—Layer A; Chapter 4.5 Patch Antenna", *In: Electromagnetic Waves—Microwave Techniques*, Obtained from http://wes.feec.vutbr.cz/~raida/multimedia_en/chapter3/3_2A.html,(2004),27 pgs.

Sarkar, T. K., "Stripline Components", *Wiley Encyclopedia of Electrical and Engineering Online*, 1999, www.mrw.interscience.wiley.com,(Observed Dec. 27, 1999),10 pgs.

Seeber, D. A., et al., "Triaxial Magnetic Field Gradient System for Microcoil Magnetic Resonance Imaging", *Review of Scientific Instruments*, 71(11), (Nov. 2000),4263-4272.

Sultan, M. A., "Extended Analysis of Closed-ring Microstrip Antenna", *IEEE Proceedings*, 136 (1), (Feb. 1989),67-69.

Tropp, J., et al., "The Prospects for Systematic Design of TEM Resonators", *Proceedings of the International Society for Magnetic Resonance in Medicine, 7th Scientific Meeting*, vol. 1, (1999),1 pg.

Tsutsumi, Makoto, "Nonlinear Behavior of Electromagnetic Waves in the YIG Film Microstrip Line", *IEEE*, 1998, (1998),841-844.

Ugurbil, K., et al., "Imaging at High Magnetic Fields: Initial Experiences at 4 T", *Magnetic Resonance Quarterly*, 9(4), (1993),259-277.

Ugurbil, K, et al., "The TEM Coil Advantage", *Bioengineering, Inc./HF Imaging, LLC*, 4 pages.

Vaughan, J T., et al., "7T vs. 4T: RF power, homogeneity, and signal-to-noise comparison in head images", *Magnetic Resonance in Medicine*, vol. 46, No. 1, (Jul. 2001),24-30.

Vaughan, J. T., et al., "A High Frequency Body Coil for Clinical NMR", *Proc.Soc. Magnetic Resonance*, (Abstract),(1994),1113.

Vaughan, J. T., "An improved Volume Coil for Hgh Field MRI", *International Science for Magnetic Resonance in Medicine, 7th Scientific Meeting*, (May 22, 1999),p. 167.

Vaughan, J T., et al., "Detunable transverse electromagnetic (TEM) volume coil for high-field NMR", *Magnetic Resonance in Medicine*, vol. 47, No. 5, (May 2002),990-1000.

Vaughan, J T., et al., "High Frequency Coils for Clinical Nuclear Magnetic Resonance Imaging and Spectroscopy", *Physica Medica*, 9, (1993),147-153.

Vaughan, J T., "High Frequency Volume Coils for Clinical NMR Imaging and Spectroscopy", *Magnetic Resonance in Medicine*, 32(2), (Aug. 1994),206-218.

Vaughan, J. T., et al., "RF Front End for a 4.1 Tesla Clinical NMR Spectrometer", *IEEE Transactions on Nuclear Science*, 42(4), (1995),1333-1337.

Vaughan, J T., "The Head Cradle: An Open Faced, High Performance TEM Coil", (1999),1 page.

Vaughn, J T., et al., "Volume coils for highest field MRI", *IEEE Antennas and Propagation Society International Symposium. 2001 Digest. Held in conjunction with: USNC/URSI National Radio Science Meeting, IEEE*. Part vol. 1, (2001),378-81.

Wen, H., "The Design and Test of a New Volume Coil for High Field Imaging", *Magnetic Resonance in Medicine*, 32(4), (1994),492-498.

Zhang, Xiaoliang et al., "A microstrip transmission line volume coil for human head MR imaging at 4T", *Journal of Magnetic Resonance 161*, (2003),242-251.

Zhang, X., "Microstrip RF Surface Coil Design for Extremely High-Field MRI and Spectroscopy", *Magnetic Resonance in Medicine*, 46(3), (Sep. 2001),443-450.

Alecci, M., et al., "Measurement of Magnetic Coupling Coefficients of TEM Resonators", *Proceedings, International Society for Magnetic Resonance in Medicine, 8th Scientific Meeting and Exhibition*, (2000), p. 566.

Alecci, M., et al., "Practical Design and Testing of Single Element TEM Resonators", *Proceedings, International Society for Magnetic Resonance in Medicine, 8th Scientific Meeting and Exhibition*, (2000), p. 645.

\* cited by examiner

ASSYMETRIC RADIO FREQUENCY MAGNETIC LINE ARRAY

CROSS-REFERENCE TO RELATED APPLICATIONS

This application is a continuation of U.S. patent application Ser. No. 11/209,450, filed Aug. 23, 2005, now abandoned which is a continuation of U.S. patent application Ser. No. 10/637,261, filed Aug. 8, 2003, now U.S. Pat. No. 6,958,607 which is a continuation of U.S. patent application Ser. No. 09/919,479, filed Jul. 31, 2001, now U.S. Pat. No. 6,788,056 which claims priority under 35 U.S.C. 119(e) from U.S. Provisional Application Ser. No. 60/222,144, filed Jul. 31, 2000, which applications are incorporated by reference herein.

FIELD

This invention relates to radio frequency magnetic field units suitable for use in connection with an imaging and/or spectroscopy system.

BACKGROUND

Radio frequency magnetic field units, such as volume coils, are used in connection with imaging and/or spectroscopy systems, such as but not limited to magnetic resonance imaging systems, nuclear magnetic resonance imaging systems, functional magnetic resonance imaging systems, and electron spin resonance systems.

A problem with many cylindrical form volume coils is that they provide limited access to the coil volume. These cylindrical form volume coils can be accessed only through the ends of the cylinders or between the radio frequency (RF) current carrying rungs or loops. The "between the rung" or lateral access is further limited when the coil is shielded. A Faraday shield on a birdcage for example, completely screens the lateral walls of the coil cylinder with typically a copper clad, etched circuit board material. The result is a "copper can." Similarly, the transverse electromagnetic (TEM) coil circuits are composed of a cylindrical symmetrical array of conductor rungs in parallel resonance with and enclosed by a copper resonant cavity. The limited access provided by end access or "between the rung" access to the coil volume affects a subject confined to the coil volume and physicians or technicians treating or interacting with the subject. Some subjects are claustrophobic and cannot tolerate confinement in a volume coil, while some medical procedures, such as brain surgery, require access to the subject during imaging. For these and other reasons there is a need for the present invention.

DESCRIPTION

Figure 1A:
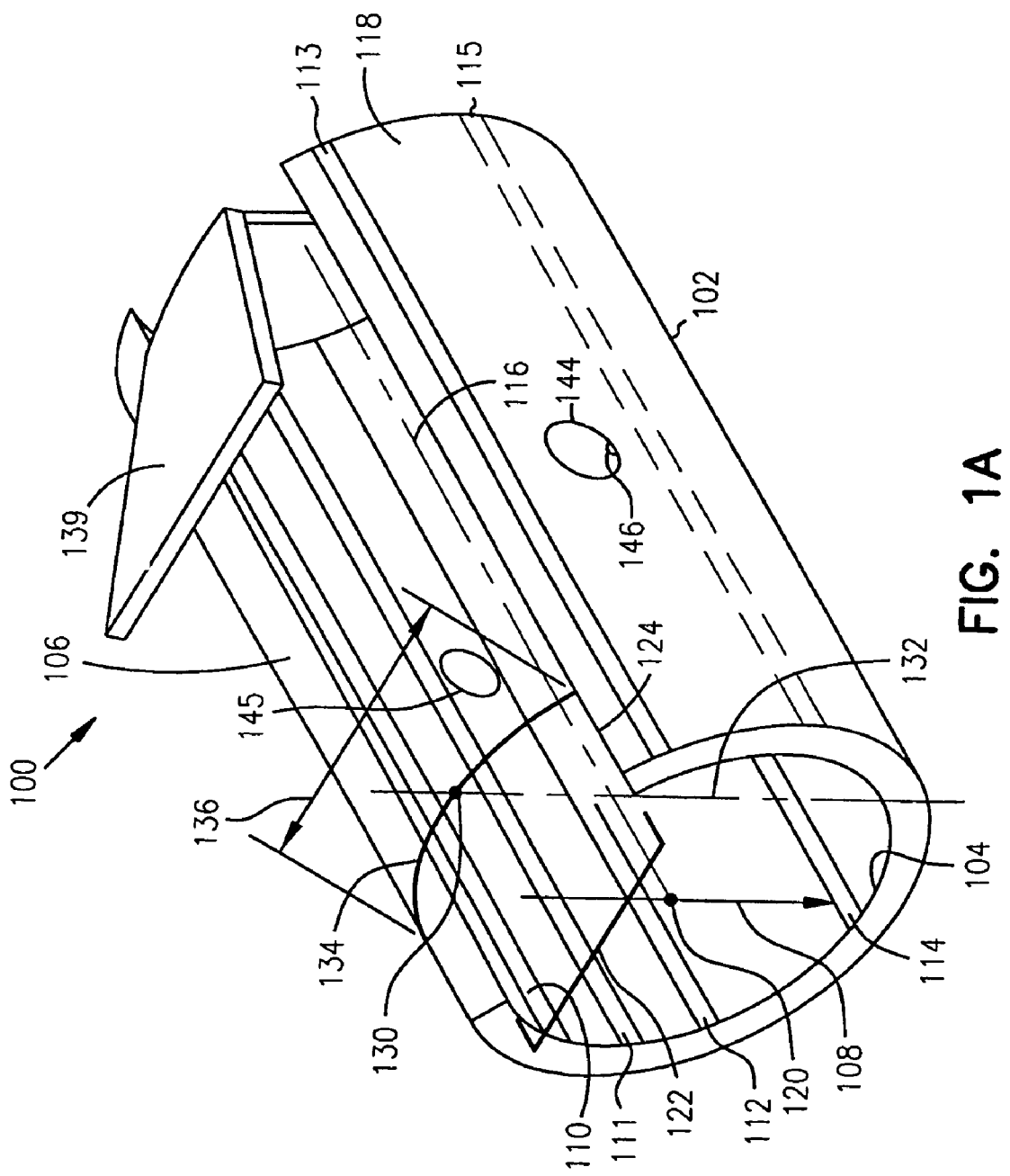
FIG. 1A is an illustration of some embodiments of an apparatus including a radio frequency magnetic field unit according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Radio frequency magnetic field units that include an aperture that is substantially unobstructed and located in a radio frequency magnetic field unit and radio frequency magnetic field units that include side apertures are described. When a radio frequency magnetic field unit that includes a first aperture that is substantially unobstructed is used in connection with an imaging system, the medical benefits associated with the use of an imaging system can be extended to claustrophobic subjects. When a radio frequency magnetic field unit that includes side apertures is used in connection with an imaging system, the medical benefits associated with the use of an imaging system can be extended to subjects that have difficulty fitting into a standard radio frequency magnetic field unit. Methods for transforming a radio frequency magnetic field unit that lacks an aperture that is substantially unobstructed into a radio frequency magnetic field unit that has an aperture that is substantially unobstructed, and methods for transforming a radio frequency magnetic field unit that lacks side apertures into a radio frequency magnetic field unit that has side apertures are also described.

In addition, including an aperture in a radio frequency magnetic filed unit, such as a coil, allows parts of the anatomy to project from the coil (e.g. nose, or arms). This allows the rest of the coil to be much smaller and fit much closer to a subject. Small, close fitting coils improve image signal efficiency which results in images of higher resolution being acquired in less time using less power.

FIG. 1A is an illustration of some embodiments of an apparatus 100 comprising a radio frequency magnetic field unit 102 according to the teachings of the present invention. The radio frequency magnetic field unit 102 includes a first aperture 104 and a second aperture 106.

The radio frequency magnetic field unit 102 generates a desired magnetic field 108. The desired magnetic field 108 is not limited to a magnetic field having a particular magnitude and direction. Preferably, the desired magnetic field 108 has a magnitude and direction suitable for use in imaging an object, such as a human head, in an imaging system, such as but not limited to a magnetic resonance imaging system, a magnetic resonance spectroscopy system, a functional magnetic resonance imaging system, or an electron spin resonance system.

The radio frequency magnetic field unit 102 is not limited to a particular type of radio frequency magnetic field unit. In one embodiment, the radio frequency magnetic field unit 102 is a TEM cavity resonator. A TEM cavity resonator includes one or more current elements having controllable elements, such as inductors and capacitors, that are varied to tune the transmission line resonator. In some embodiments, TEM cavity resonators include two open ends. In alternative embodiments, TEM cavity resonators include one open end and one closed end.

Figure 4:
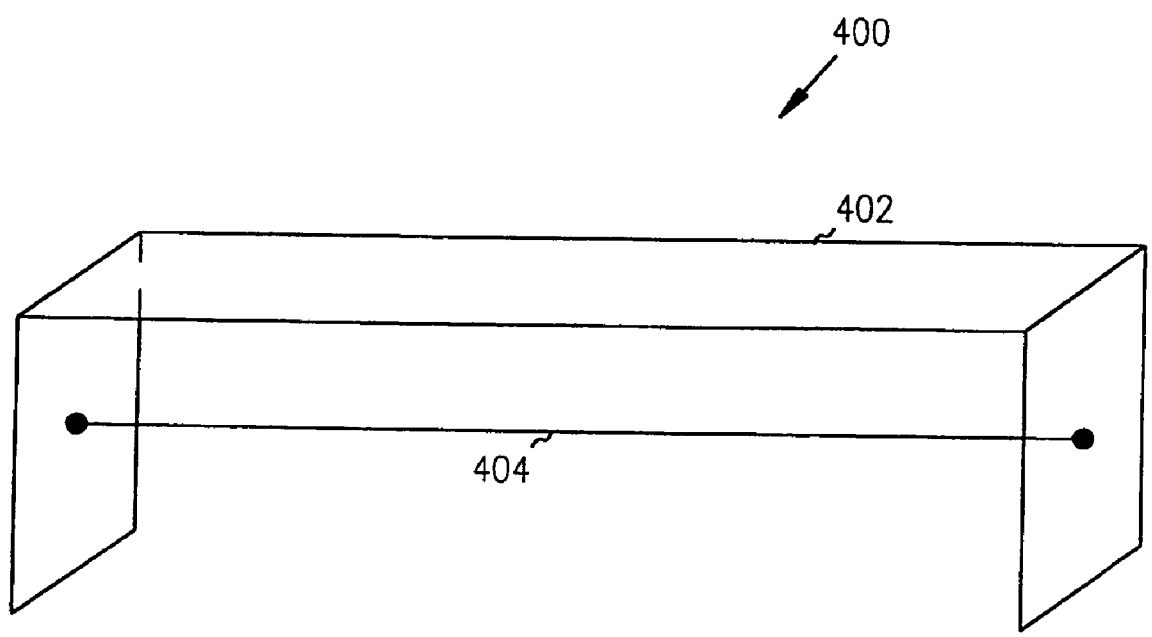
FIG. 4 is an illustration of one embodiment of a current element suitable for use in connection with the radio frequency magnetic field units of the present invention.

The radio frequency magnetic field unit 102 is not limited to a particular number of current elements (shown in FIG. 4). Current elements 110-115 shown in FIG. 1A are illustrations only and no attempt is being made to depict the detailed components of the current elements. In some embodiments, the radio frequency magnetic field unit 102 includes current elements 110-115. The current elements 110-115 are preferably arranged such that none of the elements 110-115 obstruct the second aperture 106, but the current elements 110-115 are not limited to a particular arrangement. In some embodiments, the current elements 110-115 are asymmetrically arranged, physically disconnected from one another and reactively coupled. In alternative embodiments, the current elements 110-115 are arranged to "enclose" a substantially cylindrical volume. In some embodiments, each of the current elements 110-115 is a resonant current element inductively coupled to at least one other current element. In alternative embodiments, each of the current elements 110-115 is a resonant current element capacitively coupled to at least one of the current elements 110-115. When used in connection with an imaging system (shown in FIG. 1B), the magnetic filed unit 102 is tuned to a frequency suitable to image a particular object or subject.

The radio frequency magnetic field unit 102 is not limited to a particular shape or volume. Preferably, the shape and volume of the radio frequency magnetic field unit 102 approximate the shape and volume of the object or subject to be imaged. In one embodiment, the radio frequency magnetic field unit 102 has a substantially cylindrical shape, including a diameter and a length sufficient to receive a human head. In an alternative embodiment, the radio frequency magnetic field unit 102 has a substantially cylindrical shape that includes a longitudinal axis 116 and a surface 118 that is substantially parallel to the longitudinal axis 116. The surface 118 need not be continuous. The current elements 110-115 are arranged substantially parallel to the longitudinal axis.

The first aperture 104 provides a port for introducing an object or subject into the radio frequency magnetic field unit 102. For example, a human head (not shown) can be introduced into the radio frequency magnetic field unit 102 at the first aperture 104. The head is preferably oriented within the radio frequency magnetic field unit 102 such that the eyes are directed toward the second aperture 106. With this orientation, the subject avoids the claustrophobic effects often experienced by subjects introduced into a radio frequency magnetic field unit that lacks a second aperture that is substantially unobstructed. The first aperture 104 is not limited to a particular alignment with respect to the radio frequency magnetic field unit 102. In one embodiment, the first aperture 104 has a center of mass point 120 that is substantially aligned with the longitudinal axis 116. Such an alignment permits easy introduction of the subject into the radio frequency magnetic field unit 102. The first aperture 104 is formed at an end of the radio frequency magnetic field unit 102. An end of the radio frequency magnetic field unit 102 is located at an end of the current elements 110-115.

The first aperture 104 is preferably contiguous to the second aperture 106. A contiguous second aperture 106 permits relatively easy introduction of a subject into the radio frequency magnetic field unit 102 and reduces the likelihood that the subject will experience claustrophobic effects during imaging by providing a contiguous open space that includes the first aperture 104 and the second aperture 106. The second aperture 106 also allows a subject to see outside the radio frequency magnetic field unit 102 and allows a physician or technician access to the eyes, nose and mouth of the subject.

The second aperture 106 comprises an area 122 including an unobstructed area 124 and a potentially obstructed area. An area is unobstructed, if the area is substantially transparent. An area is obstructed, if the area is not substantially transparent. Preferably, the area 122 does not include an obstructed area. The area 122 is not limited to a particular size.

The second aperture 106 has a center of mass point 130 (not drawn to scale) and a first aperture axis 132. In one embodiment, the first aperture axis 132 passes through the center of mass point 130, intersects the longitudinal access 116 and is substantially perpendicular to the longitudinal access 116. In one embodiment, the second aperture 106 subtends an arc 134 having an arc length 136 of between about 0° and about 90° as traced out by the first aperture axis 132 rotating about the longitudinal axis 118. The second aperture 106 subtending an arc 134 having an arc length 136 of greater than 0° and about 90° reduces claustrophobic effects in a human subject. However, an arc length 136 of greater than about 90° increases the difficulty in generating the desired magnetic field 108.

The second aperture 106 permits the manufacture of a radio frequency magnetic field unit 102 that closely fits the head of a human subject having a large nose. A radio frequency magnetic field unit that lacks the second aperture 106 must be sized to accommodate the large nose of a subject and therefore cannot be designed to closely fit the head of a human subject having a large nose. Since a close fitting radio frequency magnetic field unit produces higher quality images than a larger loosely fitting radio frequency magnetic field unit, the radio frequency magnetic field unit 102 including the second aperture 106 produces higher quality images than a radio frequency magnetic field unit that lacks the second aperture 106.

An imaging unit 139 can be mounted on the radio frequency magnetic field unit 102 to provide a communication link to the second aperture 106. The imaging unit 139 is located with respect to the second aperture 106 such that the imaging unit 139 provides a communication link to a subject whose head is positioned in the radio frequency magnetic field unit 102. The imaging unit 139 is not limited to a particular type of imaging unit. In one embodiment, the imaging unit 139 comprises a mirror. In an alternative embodiment, the imaging unit 139 comprises a prism. In still another alternative embodiment, the imaging unit 139 comprises a projection system.

In some embodiments, one or more apertures 144 and 145 are formed on a side of the radio frequency magnetic field unit 102 to permit access to a subject's ears. These apertures can be formed by removing a current element from a radio frequency magnetic field unit. In other embodiments, an auditory communication device 146 is attached to one or more of the one or more apertures 144 and 145 to communicate with a subject or provide auditory protection for the subject. The communication device 146 is preferably capable of providing active or passive auditory protection.

A radio frequency magnetic field unit lacking a second aperture can be transformed into the radio frequency magnetic field unit 102 that includes the second aperture 106. In one embodiment of a method to transform a radio frequency magnetic field unit lacking a second aperture into the radio frequency magnetic field unit 102 that includes the second aperture 106, one current element is removed from the radio frequency magnetic field unit lacking a second aperture to form the radio frequency magnetic field unit 102 that includes the second aperture 106. Removing one current element from a radio frequency magnetic field unit lacking a second aperture creates a void in the radio frequency magnetic field unit lacking a second aperture. This void provides an area in which to form the second aperture 106. After removing a current element from the radio frequency magnetic field unit lacking a second aperture, currents to produce the desired magnetic field 108 are calculated for the remaining current elements. In an alternative embodiment, two or more adjacent current elements are removed from a radio frequency magnetic field unit lacking a second aperture to form the radio frequency magnetic field unit 102 that includes the second aperture 106. Removing two or more adjacent current elements from an the radio frequency magnetic field unit lacking a second aperture creates a void in the radio frequency magnetic field unit lacking a second aperture. This void provides an area in which to form the second aperture 106 of the radio frequency magnetic field unit 102. After removing two or more current elements from the radio frequency magnetic field unit lacking a second aperture, currents to produce the desired magnetic field 108 are calculated for the remaining electronic circuits.

Figure 1B:
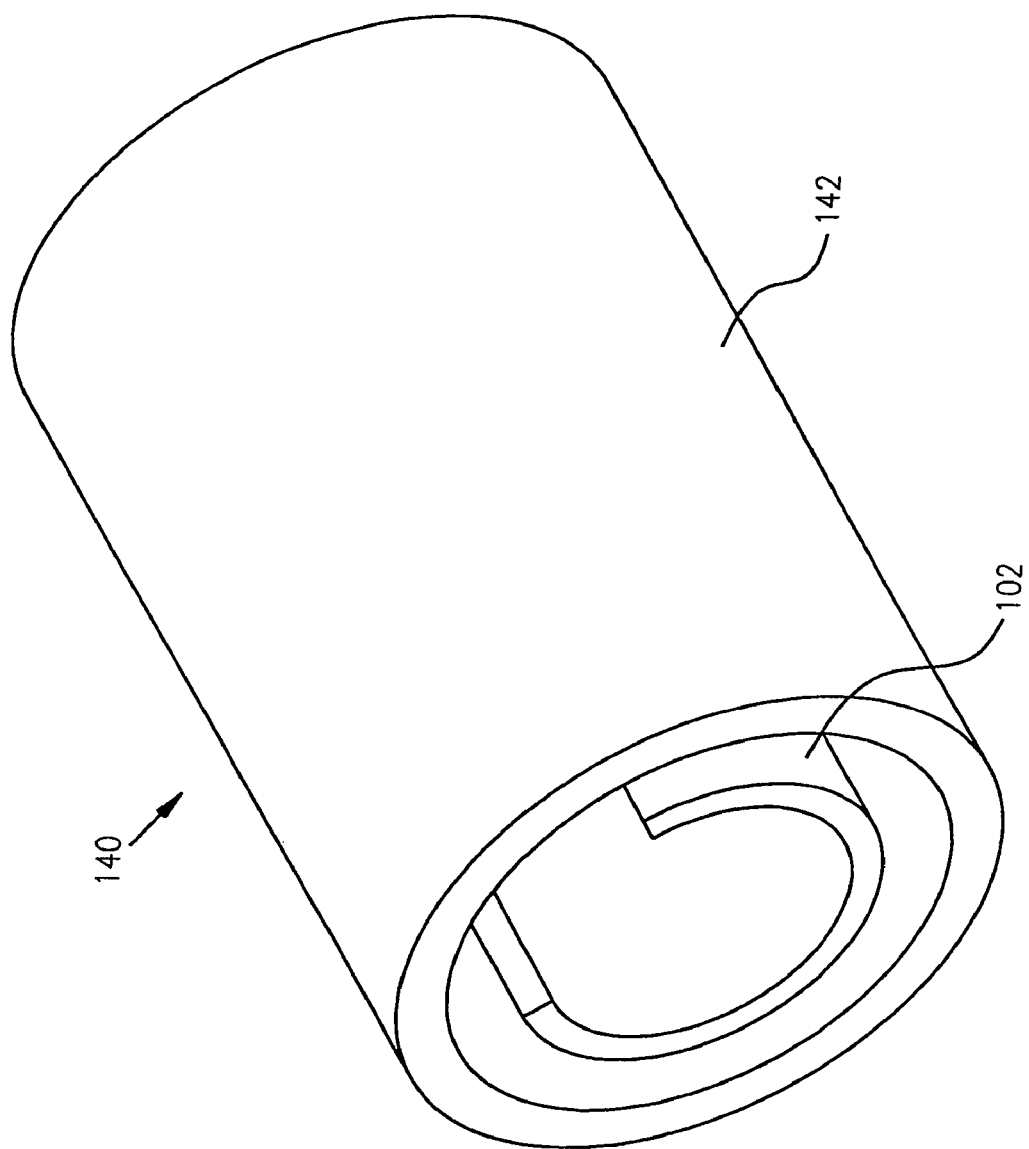
FIG. 1B is an illustration of some embodiments of an imaging unit including a radio frequency magnetic field unit according to the teachings of the present invention.

FIG. 1B is an illustration of some embodiments of an imaging unit 140 including a radio frequency magnetic field unit 102 according to the teachings of the present invention. The imaging unit 140 includes a static field magnetic field unit 142 and the radio frequency magnetic field unit 102 located within the static field magnetic field unit 142. Preferably, the static field magnetic field unit 142 produces a magnetic field having a high magnetic field strength. A high magnetic field strength enables the production of high resolution images by the imaging unit 140. However, the radio frequency magnetic field unit 102 is not limited to use in connection with a particular static magnetic field or a static field magnetic field unit that produces a particular magnetic field strength. The radio frequency magnetic field unit 102 is suitable for use in connection with any static field magnet used in connection with an imaging unit.

Figure 2A:
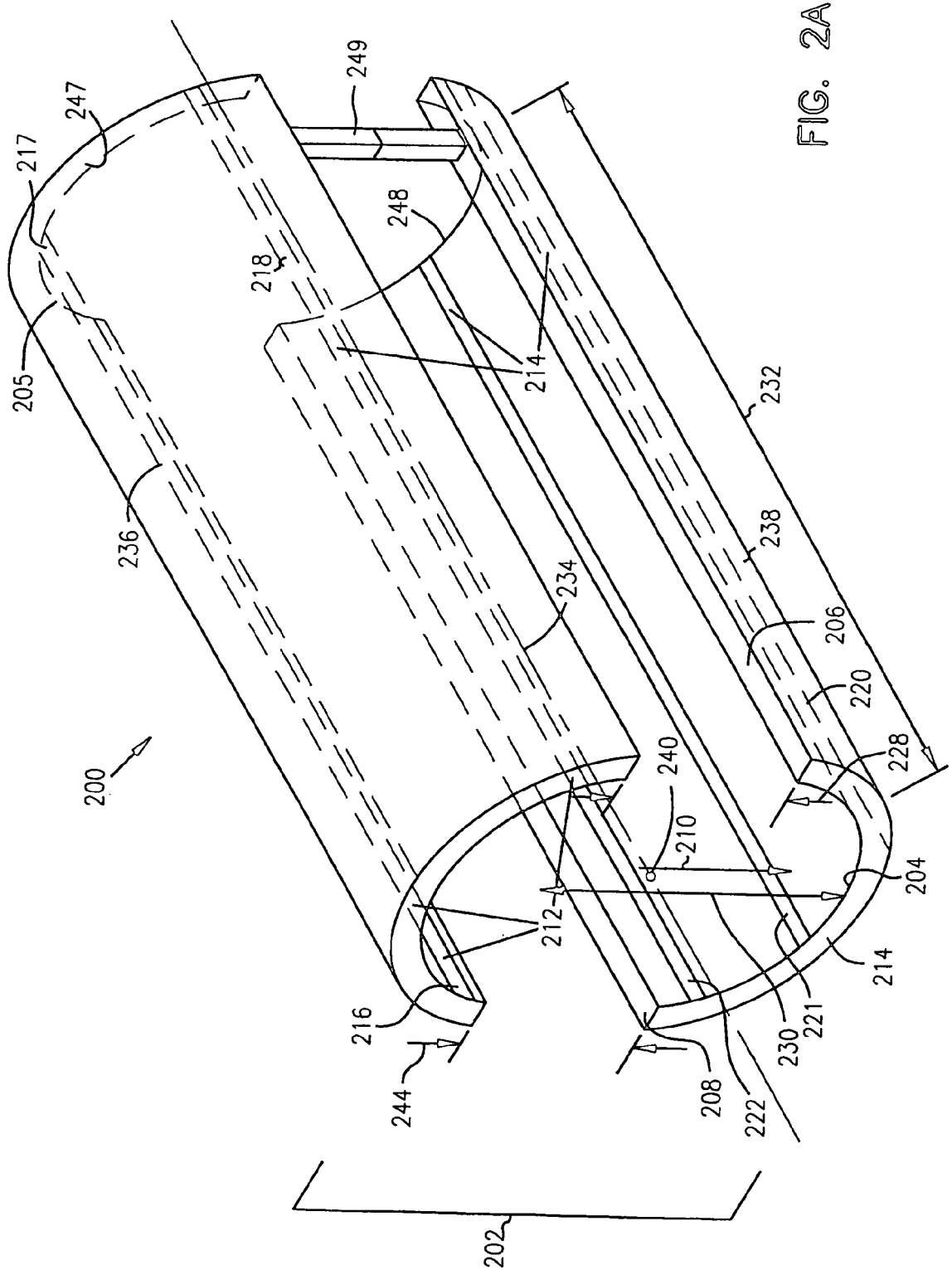
FIG. 2A is an illustration of some embodiments of an alternative embodiment of an apparatus including a radio frequency magnetic field unit according to the teachings of the present invention.

FIG. 2A is an illustration of some embodiments of an apparatus 200 comprising a radio frequency magnetic field unit 202 according to the teachings of the present invention. The radio frequency magnetic field unit 202 includes a pair of end apertures 204 and 205, a first side aperture 206 and a second side aperture 208.

The radio frequency magnetic field unit 202 generates a desired magnetic field 210. The desired magnetic field 210 is not limited to a magnetic field having a particular magnitude and direction. Preferably, the desired magnetic field 210 has a magnitude and direction suitable for use in imaging an object, such as a human body, in an imaging system, such as but not limited to a magnetic resonance imaging system, a functional magnetic resonance imaging system or an electron spin resonance system.

The radio frequency magnetic field unit 202 is not limited to a particular type of radio frequency magnetic field unit. In one embodiment, the radio frequency magnetic field unit 202 is a TEM cavity resonator. A TEM cavity resonator includes one or more current elements having controllable elements that are varied to tune the transmission line resonator. In one embodiment, the radio frequency magnetic field unit 202 comprises a first group of current elements 212 and a second group of current elements 214. In one embodiment, the first group of current elements 212 include at least one current element, such as current elements 216-218, and the second group of current elements 214 include at least one current element, such as current elements 220-222. The first group of current elements 212 and the second group of current elements 214 are preferably arranged such that none of the current elements 216-218 or the current elements 220-222 obstruct the first side aperture 206 or the second side aperture 208. In one embodiment, the first group of current elements 212 are separated from the second group of current elements 214 by a separation distance 228 of between about 15 centimeters and about 30 centimeters which is the area available to form the first side aperture 206 and the second side aperture 208. A separation distance of less than about 15 centimeters is insufficient to permit extremities, such as arms or legs, or excess body mass, of a subject to fit into the first side aperture 206 and the second side aperture 208. A separation distance 228 of greater than about 30 centimeters results in the radio frequency magnetic field unit 202 having a volume significantly greater than necessary to receive a human body. When used in connection with an imaging system (shown in FIG. 2B), the magnetic field unit 202 is tuned to a frequency suitable to image a particular object or subject.

A tunable TEM resonator according to the invention has a cavity and a set of transmission line segments which provide a high frequency magnetic field in the cavity. Circuitry including the distributed impedance of all the segments together determines the field frequency.

A preferred form of segment is a length of coaxial transmission line, wherein the center conductor's length is interrupted intermediately, so that the circuitry, of which it forms part, incorporates it as a half-wave resonator balanced with respect to a virtual ground plane of the cavity.

The first side aperture 206 and the second side aperture 208 permit the extremities or excess body mass of a subject (not shown) to be positioned outside the radio frequency magnetic field unit 202 when the subject is located inside the radio frequency magnetic field unit 202. The first side aperture 206 and the second side aperture 208 are substantially parallel to the first group of current elements 212 and the second group of current elements 214. The first side aperture 206 and the second side aperture 208 are preferably free of physical obstructions. A physical obstruction is a structure that prevents the extremities or excess body mass of a subject from extending into and through the first side aperture 206 or the second side aperture 208. The first side aperture 206 and the second side aperture 208 also permit the radio frequency magnetic field unit 202 to receive subjects larger than an inside diameter 230 of the radio frequency magnetic field unit 202 without increasing the inside diameter 230 of the radio frequency magnetic field unit 202. For many subjects, the first side aperture 206 and the second side aperture 208, by allowing extremities or excess body mass to extend outside the radio frequency magnetic field unit 202, increase the subject's comfort when positioned inside the radio frequency magnetic field unit 202. A comfortable subject tends to move less during imaging, and therefore fewer imaging retakes are required and higher quality images are obtained when the subject is imaged. In addition, the smaller, closer coil improves image quality significantly for body coils. The smaller sized coil can be made to resonate efficiently at the high frequencies required for high field strength imaging.

The radio frequency magnetic field unit 202 is not limited to a particular shape or volume. Preferably, the shape and volume of the radio frequency magnetic field unit 202 approximate the shape and volume of the object or subject to be imaged. For example, a substantially cylindrical radio frequency magnetic field unit having a length 232 of about 100 centimeters and the diameter 230 of about 60 centimeters has a shape that approximates the shape of a human body. In one embodiment, the radio frequency magnetic field unit 202 has a substantially cylindrical shape, including a diameter and a length sufficient to receive an adult human body.

In an alternative embodiment, the radio frequency magnetic field unit 202 has a substantially cylindrical shape that includes a longitudinal axis 234 and surfaces 236 and 238 that are preferably curved and substantially parallel to the longitudinal axis 234. The surfaces 234 and 236 need not be continuous. The first group of current elements 212 including the at least three current elements 216-218 and the second group of current elements 214 including the at least three current elements 220-222 are arranged to "enclose" a substantially cylindrical volume.

The end aperture 204 provides a port for introducing an object or subject into the radio frequency magnetic field unit 202. For example, a human body (not shown) can be introduced into the radio frequency magnetic field unit 202 at the end aperture 204. The end aperture 204 is not limited to a particular alignment with respect to the radio frequency magnetic field unit 202. In one embodiment, the end aperture 204 includes a center of mass point 240 that is substantially aligned with the longitudinal axis 234.

In one embodiment, the first side aperture 206 and the second side aperture 208 are contiguous to end aperture 204. A contiguous relationship between the first side aperture 206, the second side aperture 208 and the end aperture 204 permits easy introduction of a subject into the radio frequency magnetic field unit 202. The first side aperture 206 has a width or separation distance 228 and the second side aperture 208 has a width or separation distance 244. The width or separation distance 228 is preferably about equal to the width or separation distance 244.

In some embodiments, the radio frequency magnetic field unit 202 includes a top-half 247 and a bottom-half 248, the top-half 247 capable of being mechanically attached and detached to the bottom-half 248 at the first side aperture 206 or the second side aperture 208. In one embodiment, an attachment device 249, such as a hinge or flexible bracket, attaches the top-half 247 to the bottom half 248.

A radio frequency magnetic field unit lacking a first side aperture and a second side aperture can be transformed into the radio frequency magnetic field unit 202 including the first side aperture 206 and the second side aperture 208. In one embodiment of a method to transform a radio frequency magnetic field unit lacking a first side aperture and a second side aperture into a radio frequency magnetic field unit 202 that includes the first side aperture 206 and the second side aperture 208, two non-adjacent current elements are removed from the radio frequency magnetic field unit lacking a first side aperture and a second side aperture. Preferably, the two non-adjacent current elements are located opposite from one another. Removing two non-adjacent current elements from the radio frequency magnetic field unit that lacks a first side aperture and a second side aperture creates two voids in the radio frequency magnetic field unit. These voids provide areas in which to form the first side aperture 206 and the second side aperture 208. After removing two non-adjacent current elements from the radio frequency magnetic field unit lacking a first side aperture and a second side aperture, currents to produce the desired magnetic field 210 are calculated for the remaining current elements.

Figure 2B:
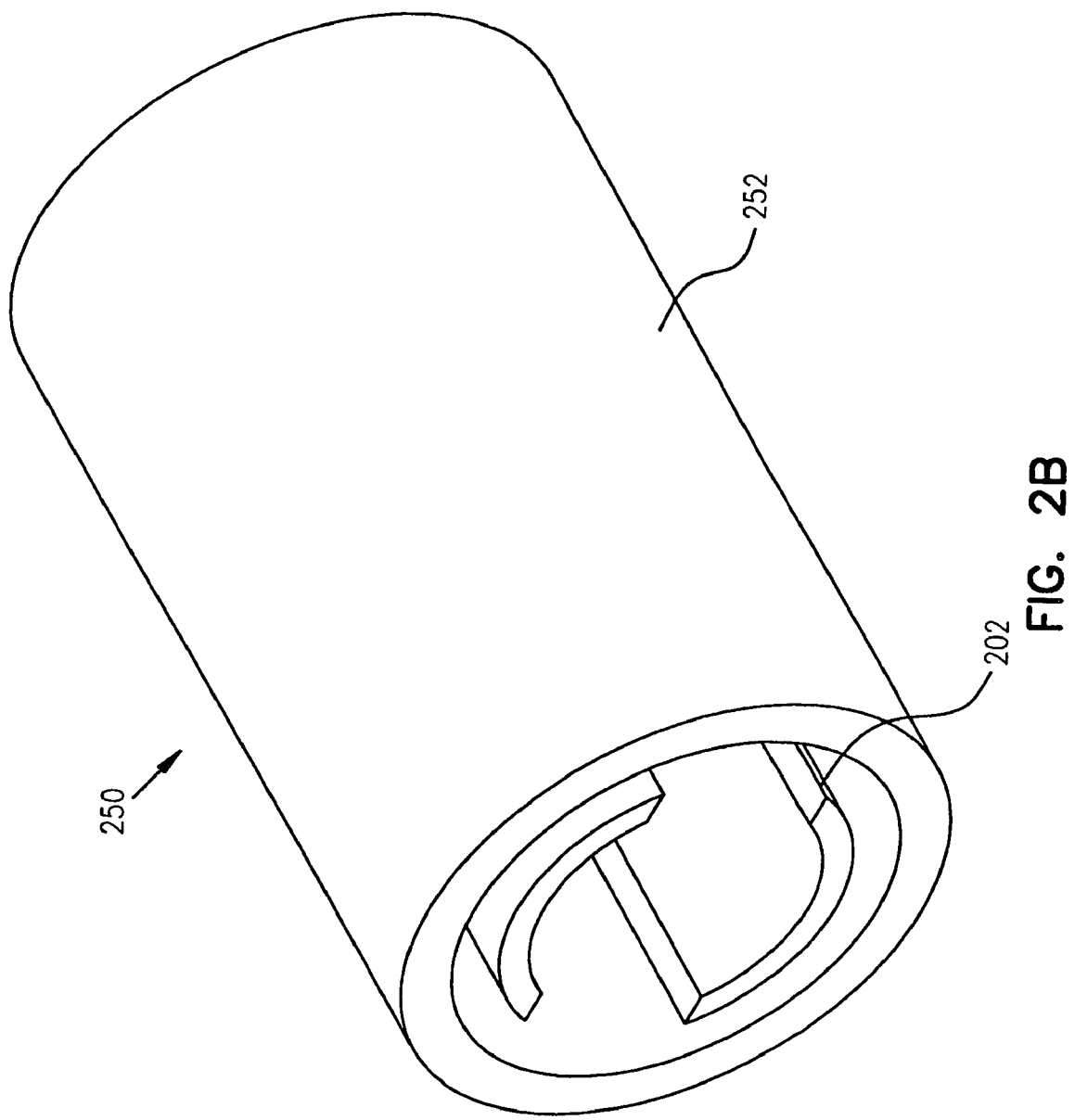
FIG. 2B is an illustration of some alternative embodiments of an imaging unit including a radio frequency magnetic field unit according to the teachings of the present invention.

FIG. 2B is an illustration of some embodiments of an imaging unit 250 including the radio frequency magnetic field unit 202 according to the teachings of the present invention. The imaging unit 250 includes a static-field magnetic field unit 252 and the radio frequency magnetic field unit 202 located within the static-field magnetic field unit 252. Preferably, the static-field magnetic field unit 252 produces a magnetic field having a high magnetic field strength. A high magnetic field strength enables the production of high resolution images by the imaging unit 250. However, the radio frequency magnetic field unit 202 is not limited to use in connection with a static-field magnetic field unit or a static-field magnetic field unit that produces a particular magnetic field strength. The radio frequency magnetic field unit 202 is suitable for use in connection with any static-field magnetic field unit used in connection with an imaging unit.

Figure 2C:
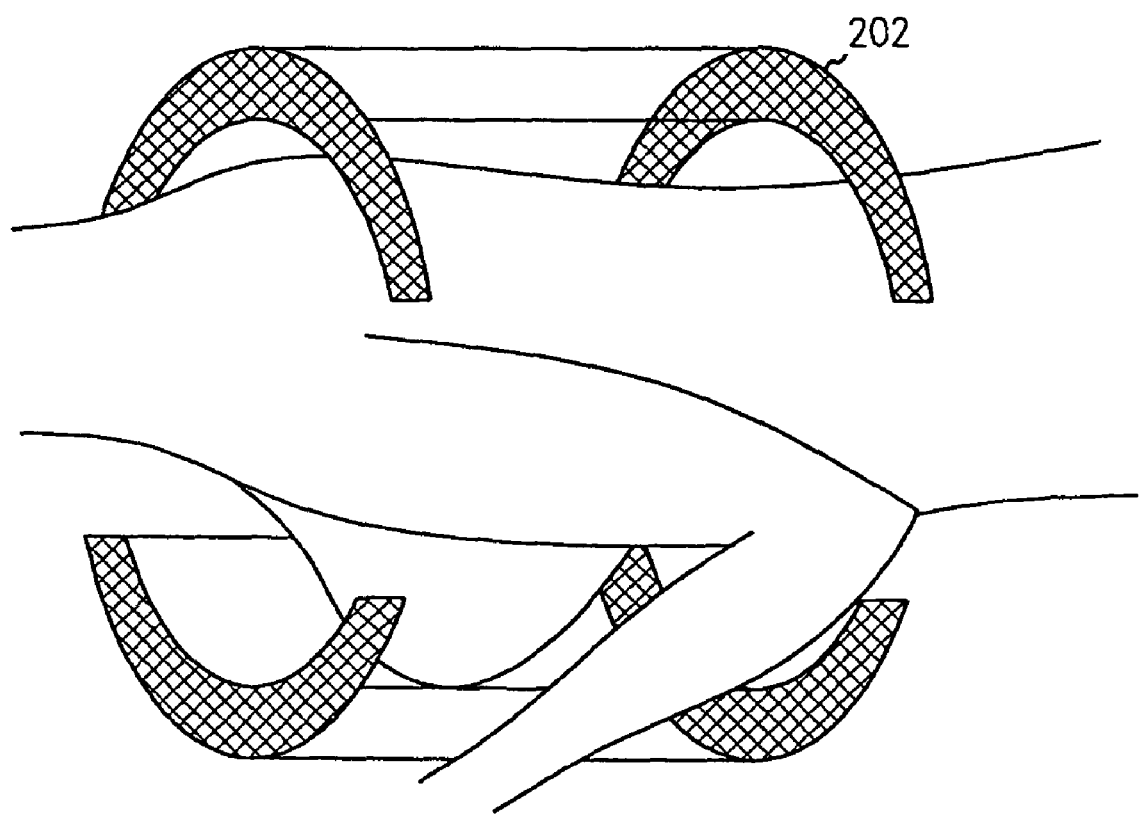
FIG. 2C is an illustration of some embodiments of the apparatus including the radio frequency magnetic field unit shown in FIG. 2A configured for use in a clinical setting.

FIG. 2C is an illustration of some embodiments of the apparatus including the radio frequency magnetic field unit 202 shown in FIG. 2A configured for use in a clinical setting. As can be seen in FIG. 2C, a subject easily and comfortable fits into a close fitting radio frequency magnetic field unit 202 which makes radio frequency magnetic field unit 202 particularly well suited for use in heart, lung and breast imaging applications.

Although the embodiments described above were directed to radio frequency magnetic field units for use in connection with imaging a human head and body, the radio frequency magnetic field units 102 and 202 are not limited to use in connection with imaging a human head and body. The radio frequency magnetic field units 102 and 202 are suitable for use in connection with imaging a wide range of subjects including but not limited to human extremities, such as arms, legs, joints, hands and feet, non-human subjects, such as dogs, cats, mice, rats, horses, and primates and the extremities of those non-human subjects.

FIG. 3A-3D are illustrations of some embodiments of the structure of a volume coil 300 according to the teachings of the present invention. The volume coil 300 includes a cavity wall 301, which is not shaded so that the underlying structure of the volume coil 300 can be seen. The volume coil 300 shown in FIG. 3A-3D includes current elements 302-308. The volume coil 300 shown in FIG. 3A includes a radio frequency conductive front end ring 310 and a radio frequency conductive backplane 312. The radio frequency conductive front end ring 310 and the radio frequency conductive backplane 312 are coupled to the current elements 302-308.

Figure 3A:
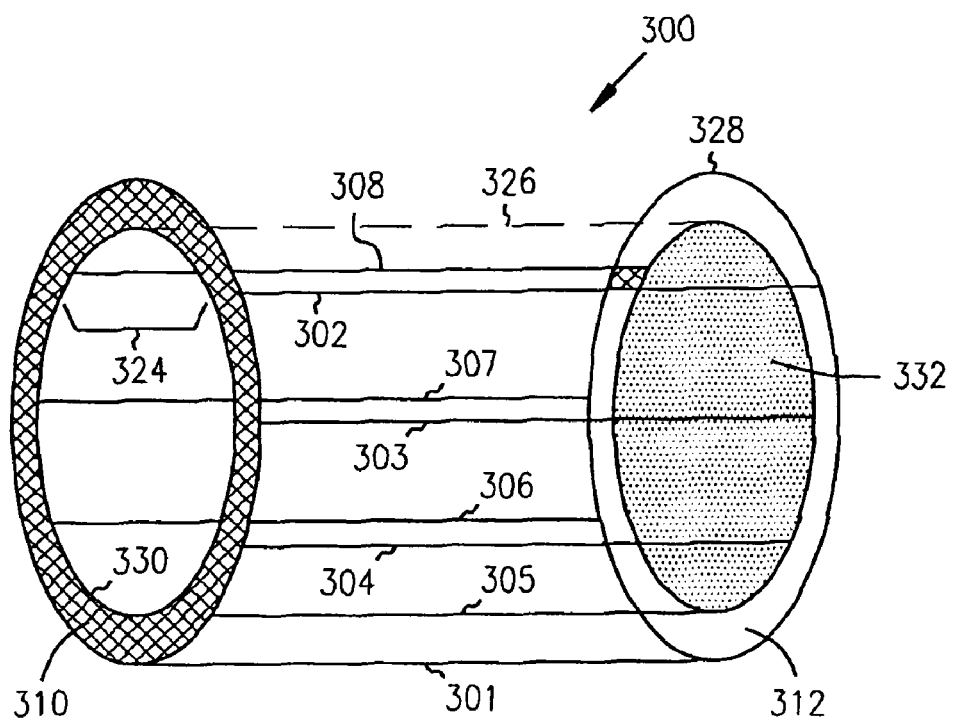
FIG. 3A-3D are illustrations of some embodiments of the structure of a volume coil according to the teachings of the present invention.
Figure 3B:
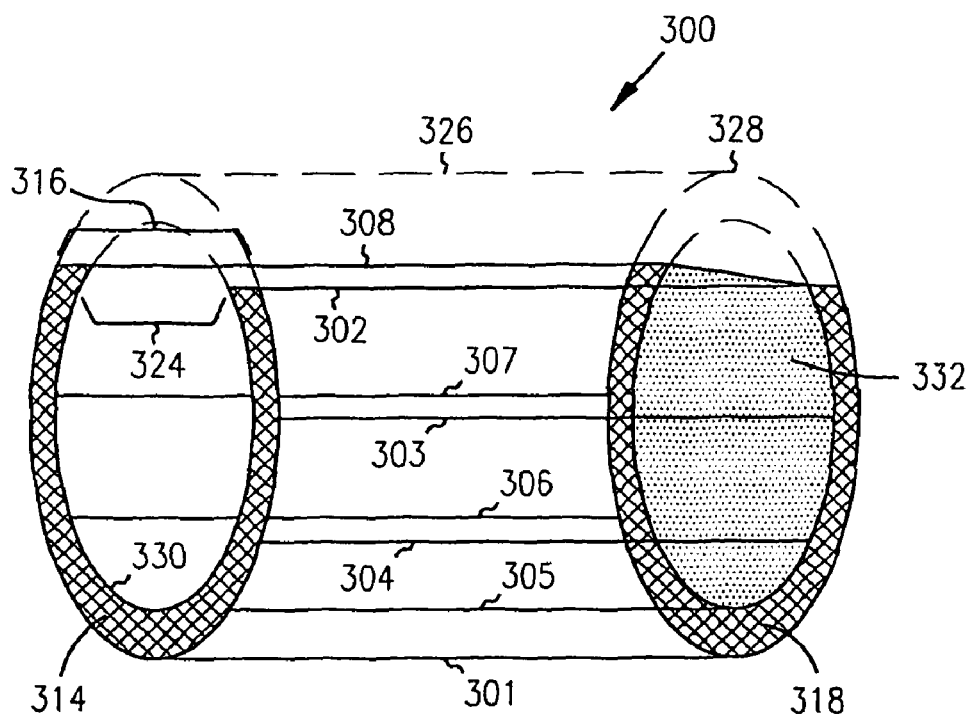

The volume coil 300 shown in FIG. 3B includes a radio frequency conductive front end ring 314 having a gap 316 and a radio frequency conductive backplane 318 truncated to the current elements 302 and 308. The radio frequency conductive front end ring 314 and the radio frequency conductive backplane 318 are coupled to the current elements 302-308.

Figure 3C:
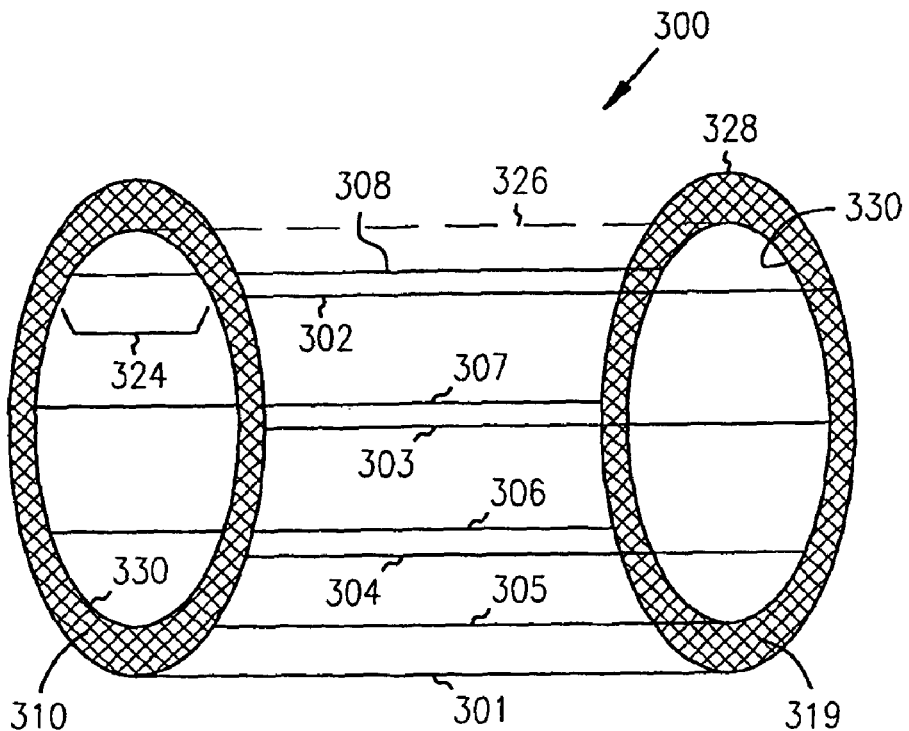

The volume coil 300 shown in FIG. 3C includes a radio frequency conductive front end ring 310 and a radio frequency conductive back end ring 319. The radio frequency conductive front end ring 310 and the radio frequency conductive back end ring 319 are coupled to the current elements 302-308.

Figure 3D:
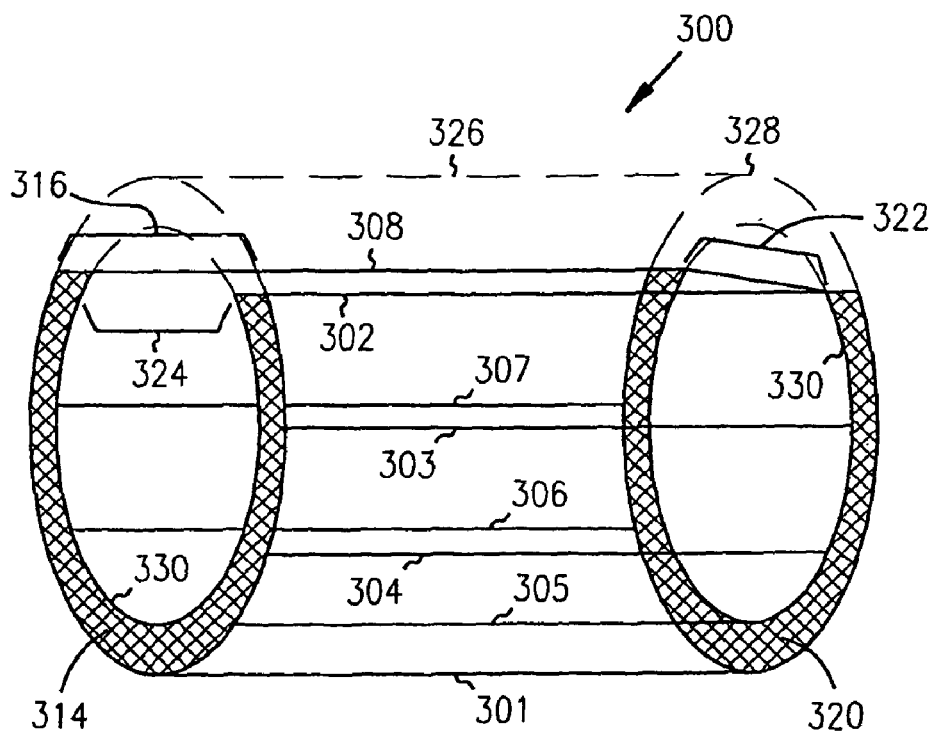

The volume coil 300 shown in FIG. 3D includes a radio frequency conductive front end ring 314 having a gap 316 and a radio frequency conductive back end ring 320 having a gap 322. The radio frequency conductive front end ring 314 and the radio frequency conductive back ring 320 are coupled to the current elements 302-308.

As can be seen in FIGS. 3A-3D, the volume coil 300 includes an aperture 324 formed between the current elements 302 and 308. Also, as can be seen in FIG. 3A-3D, the aperture 324 is formed by removing a current element 326 (shown by a dashed line) from a regular or symmetrical arrangement of current elements that includes current elements 302-308 and current element 326 (shown by a dashed line). In an alternative embodiment, the current element 326 is removed from the top 328 of the volume coil 300. In another alternative embodiment, the current element 326 is displaced (rather than removed) to form an the aperture 324.

Each of the end rings 310, 314, 319 and 320 comprise an open end 330 of the volume coil 300 and each of the backplanes 312 and 318 comprise a closed end 332 of the volume coil 300.

The volume coil 300 includes an impedance. In one embodiment, an adjustable impedance is included in each of the current elements 302-308. The adjustable impedance, in one embodiment, is a capacitance. The adjustable impedance, in an alternative embodiment, is an inductance.

In one embodiment, the cavity wall 301 comprises return elements of the current elements 302-308. In an alternative embodiment, the cavity wall 301 comprises a slotted shield. As can be seen in FIG. 3A-3D, the cavity wall 301 includes an aperture in line with the missing or displaced current element 326.

The volume coil 300 is suitable for use in imaging a wide range of objects and subjects including but not limited to heads, ankles, feet, and other extremities.

Each of the radio frequency magnetic field units 102 and 202 and the volume coils 300 described above is suitable for use as a double tuned coil, a multiply tuned coil, a circularly polarized coil, a coil doubly tuned by the Vaughan method and an actively detuned coil. A double tuned coil is driven at two frequencies. A multiply tuned coil is driven at multiple frequencies. A circularly polarized coil is driven to impart a circularly polarized radio frequency magnetic field. The Vaughan method of doubly detuning a coil is described in U.S. Pat. No. 5,557,247 titled "High Frequency Volume coils for Nuclear magnetic Resonance Applications" which is hereby incorporated herein by reference. Each of the radio frequency magnetic field units 102 and 202 and the volume coil 300 are capable of being actively detuned/retuned for use with a local receiving coil by adjusting the current elements included in the coil. The current elements are adjusted by changing the impedance of the current elements.

FIG. 4 is an illustration of one embodiment of a current element 400 suitable for use in connection with the radio frequency magnetic field units of the present invention. The current element 400 includes a shield or cavity wall section 402 resonant with a conductor 404. The cavity wall section 402 is formed from a conductive material and the conductor 404 is formed from a conductive material. In one embodiment, the cavity wall section 402 is formed from a conductive mesh. A plurality of current elements 400 can be arranged to form an "enclosure." In one embodiment, a plurality of current elements 400 are arranged to form a cylindrical enclosure (not shown). In a cylindrical enclosure, the shield or cavity wall section 402 is oriented to the outside of the enclosure and the conductor 404 is oriented to the inside of the enclosure. Current elements, such as current element 400, are further described in U.S. Pat. No. 5,557,247 which is hereby incorporated by reference herein.

Figure 5A:
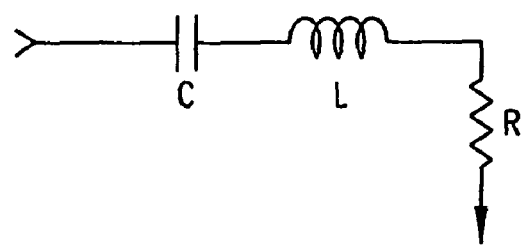
FIGS. 5A, 5B, 5C, 5D compare lumped element resonant circuits to transmission line analogues.
Figure 5B:
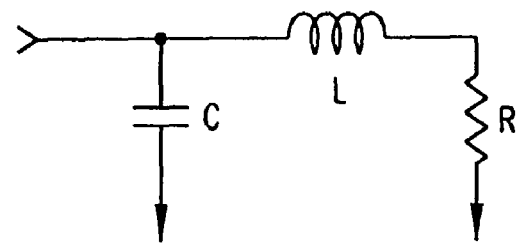
Figure 5C:
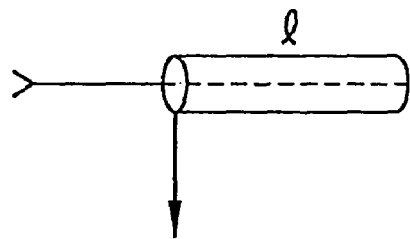
Figure 5D:
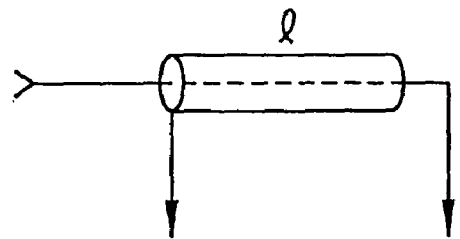
Figure 6A:
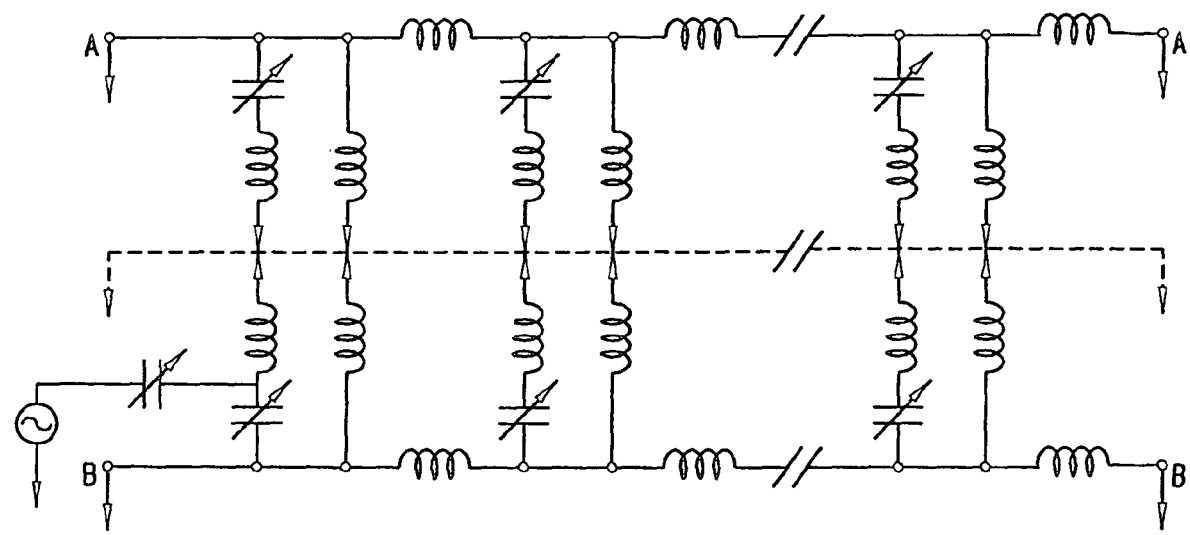
FIGS. 6A and 6B show alternative circuit models for a tuned TEM resonator according to the present subject matter.
Figure 6B:
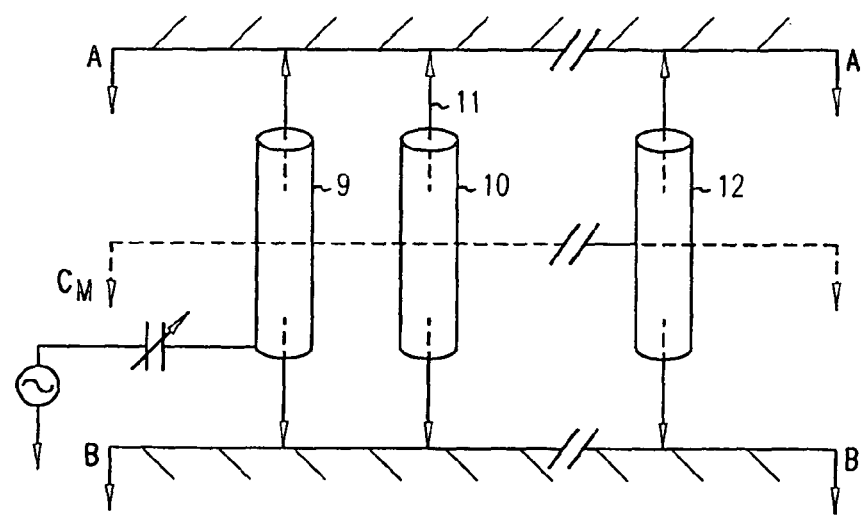

Transmission line theory was used to describe the tuned TEM resonator as a transmission line tuned coaxial cavity resonator. Alternatively, the TEM resonator can be approximated as a balanced comb-line, band-pass filter using a lumped element circuit of FIG. 6A. The lumped elements in this circuit approximate the distributed element coefficients of the transmission line circuit. Analysis of this lumped element filter circuit model adhering to methods in the literature for "bird-cage" resonators gives inaccurate results. A more accurate approach considers the lumped element filter's distributed stripline analogue in FIG. 6B. This network is a quarter wave (as in FIGS. 5A and 5C) comb-line filter interfaced with its mirrored image at the virtual ground plane of symmetry indicated by the dotted line. Each coaxial element, due to its split central conductor, therefore is a resonant half wave line (mirrored quarter wave pair, as in FIGS. 5B and 5D wave pair) whose bisected center conductor 11 is grounded at both ends to a cavity. The elements 9 are coupled via the TEM slow wave propagation h the cavity. The performance characteristics of this distributed structure are calculated from TEM assumptions.

Because the TEM coil has no endring currents (as does the birdcage), sections of the TEM coil can be removed entirely to provide maximum access with minimal impact to the compensated RF field of the invention volume coil. Because the TEM coil return current is parallel to the coil rungs, the return paths can be discretized to narrow, unobtrusive conductors such as 1 cm strips of transparent screen. The integrity of the TEM cavity is thus approximately maintained while providing through the rung access, in addition to the entirely unobstructed access provided by removal of both an element and its corresponding return path on the cavity.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An apparatus comprising:
a volume coil including a plurality of current elements, the volume coil having a first end, a second end, and at least one substantially unobstructed side aperture formed by removal or displacement of one or more current elements from a symmetrical arrangement of current elements, wherein the at least one substantially unobstructed side aperture extends from at least one of the first end or the second end to at least half way between the first end and the second end, and wherein the current elements are physically disconnected from each other and are reactively coupled to each other.

2. The apparatus of claim 1, wherein the first end defines a first end aperture of the volume coil.

3. The apparatus of claim 2, wherein the at least one side aperture is contiguous with the first end aperture of the volume coil.

4. The apparatus of claim 1, wherein the second end defines a closed end of the volume coil.

5. The apparatus of claim 1, wherein the second end defines a second end aperture of the volume coil.

6. The apparatus of claim 1, wherein each of the current elements are oriented lengthwise in a direction substantially parallel to a longitudinal axis of the volume coil.

7. The apparatus of claim 1, wherein the at least one side aperture includes a single side aperture.

8. The apparatus of claim 1, wherein the at least one side aperture includes a plurality of side apertures.

9. The apparatus of claim 8, wherein the side apertures are each arranged on radially opposite sides of the volume coil.

10. The apparatus of claim 1, wherein the volume coil includes an impedance, and wherein the impedance is selectively adjustable to control the current in one or more of the current elements.

11. The apparatus of claim 1 wherein the plurality of current elements are transmission lines.

12. An apparatus comprising:
a volume coil including a plurality of current elements, the volume coil having a first end, a second end, and at least one substantially unobstructed side aperture formed by removal or displacement of one or more current elements from a symmetrical arrangement of current elements, wherein the at least one substantially unobstructed side aperture extends from at least one of the first end or the second end to at least half way between the first end and the second end, wherein each of the current elements is a resonant current element inductively and capacitively coupled to at least one other current element.

13. The apparatus of claim 12, wherein the first end defines a first end aperture of the volume coil.

14. The apparatus of claim 13, wherein the at least one side aperture is contiguous with the first end aperture of the volume coil.

15. The apparatus of claim 12, wherein the second end defines a closed end of the volume coil.

16. The apparatus of claim 12, wherein the second end defines a second end aperture of the volume coil.

17. The apparatus of claim 12, wherein each of the current elements are oriented lengthwise in a direction substantially parallel to a longitudinal axis of the volume coil.

18. The apparatus of claim 12, wherein the at least one side aperture includes a single side aperture.

19. The apparatus of claim 12, wherein the at least one side aperture includes a plurality of side apertures.

20. The apparatus of claim 19, wherein the side apertures are each arranged on radially opposite sides of the volume coil.

21. The apparatus of claim 12, wherein the volume coil includes an impedance, and wherein the impedance is selectively adjustable to control the current in one or more of the current elements.

22. The apparatus of claim 12 wherein the plurality of current elements are transmission lines.

* * * * *

UNITED STATES PATENT AND TRADEMARK OFFICE
CERTIFICATE OF CORRECTION

| | |
|---|---|
| PATENT NO. | : 7,893,693 B2 |
| APPLICATION NO. | : 11/415366 |
| DATED | : February 22, 2011 |
| INVENTOR(S) | : J. Thomas Vaughan et al. |

It is certified that error appears in the above-identified patent and that said Letters Patent is hereby corrected as shown below:

Column 1
Line 16 Before "FIELD" should include -- GOVERNMENT RIGHTS --
Below this heading should read -- This invention was made with government support under CA76535, CA64338, and RR08079 awarded by the National Institutes of Health. The government has certain rights in the invention. --

Signed and Sealed this

Thirty-first Day of May, 2011

David J. Kappos
*Director of the United States Patent and Trademark Office*